(12) United States Patent
Rubaldo et al.

(10) Patent No.: US 8,530,843 B2
(45) Date of Patent: Sep. 10, 2013

(54) METHOD FOR PUTTING A COOLED INFRARED DETECTOR INTO OPERATION

(75) Inventors: Laurent Rubaldo, Fontaine (FR); Patrick Maillart, La Murette (FR); Michel Zecri, Bevenais (FR)

(73) Assignee: Societe Francaise de Detecteurs Infrarouges—Sofradir, Chateney Malabry (FR)

( * ) Notice: Subject to any disclaimer, the term of this patent is extended or adjusted under 35 U.S.C. 154(b) by 0 days.

(21) Appl. No.: 13/105,389

(22) Filed: May 11, 2011

(65) Prior Publication Data

US 2011/0278462 A1   Nov. 17, 2011

(30) Foreign Application Priority Data

May 17, 2010 (FR) ...................................... 10 02065

(51) Int. Cl.
*G01J 5/20* (2006.01)
(52) U.S. Cl.
USPC ......................................................... 250/340
(58) Field of Classification Search
USPC .......................................................... 250/340
See application file for complete search history.

(56) References Cited

U.S. PATENT DOCUMENTS

| 4,628,695 A | 12/1986 | Berdahl |
| 4,754,141 A * | 6/1988 | Mindock ........................ 250/343 |
| 5,030,831 A | 7/1991 | Coon et al. |
| 2003/0038332 A1 * | 2/2003 | Kimura ......................... 257/467 |
| 2004/0236530 A1 * | 11/2004 | Chu et al. ...................... 702/117 |
| 2005/0083567 A1 | 4/2005 | Chun Liu et al. |

* cited by examiner

Primary Examiner — Marcus Taningco
(74) Attorney, Agent, or Firm — Oliff & Berridge, PLC

(57) ABSTRACT

In an infrared detector provided with a photodiode, when the temperature of the photodiode is lowered to its operating temperature, the photodiode is forward biased. During forward biasing of the photodiode, injection of a majority carrier current takes place through the photodiode. The majority carriers mask a part of the defects of the photodiode. The acquisition phase is then performed by reverse biasing the photodiode.

9 Claims, 1 Drawing Sheet

METHOD FOR PUTTING A COOLED INFRARED DETECTOR INTO OPERATION

BACKGROUND OF THE INVENTION

The invention relates to a method for putting a cooled infrared detector provided with a photodetector into operation comprising lowering the temperature of the photodetector.

STATE OF THE ART

When designing a photodetector matrix of an infrared detector, disparities always exist between the different photodetectors. Although the latter are fabricated in the same way, using the same methods, in the same machines and at the same time, it is not possible to prevent certain photodetectors (and therefore certain pixels) from having an atypical behavior characterized by a different output level from the other photodetectors and/or excessive noise.

This problem is particularly inconvenient in the field of cooled photodetectors for which these atypical or defective pixels may generate false alarms. These photodetectors may for example present high noise levels or very different output levels from the others, which greatly reduces the performances of the photodetector and/or the performances of the photodetector matrix.

An evolution of defective pixels also exists according to the operating temperature, both in number and as regards their electric performances.

A simple way of overcoming this problem is to perform in-plant calibration to determine which are the atypical pixels and to artificially exclude the atypical pixels from the matrix. When this is possible, this operation is performed regularly so as to take account of the evolutions of the defective pixel distribution. However, in a large number of applications, it is not possible to perform calibration after leaving the manufacturing plant and/or calibration in operational mode.

Although it is established that these drifts in functioning of the photodetectors are linked to the electrically active traps present in the bandgap of the sensitive material of the photodetector and/or of the different materials used in manufacturing, no solution has been proposed to reduce their influence efficiently and lastingly.

OBJECT OF THE INVENTION

The object of the invention is to provide a method that is easy to implement and that enables the probability of a photodetector having an atypical behavior to be reduced.

The method according to the invention is characterized by the appended claims and in particular by the fact that it comprises lowering the temperature of the photodiode from a first temperature to a second temperature lower than the first temperature and applying a first biasing condition at the terminals of the photodiode during lowering of the temperature to the second temperature.

BRIEF DESCRIPTION OF THE DRAWINGS

Other advantages and features will become more clearly apparent from the following description of particular embodiments of the invention given for non-restrictive example purposes only and represented in the appended drawings, in which FIGS. 1 and 2 schematically represent particular embodiments of an infrared detector.

DESCRIPTION OF A PREFERRED EMBODIMENT OF THE INVENTION

The detector infrared comprises a photodetector 1 operating at low temperature, i.e. a photodetector 1 that needs to be cooled in order to function normally.

Figure 1:
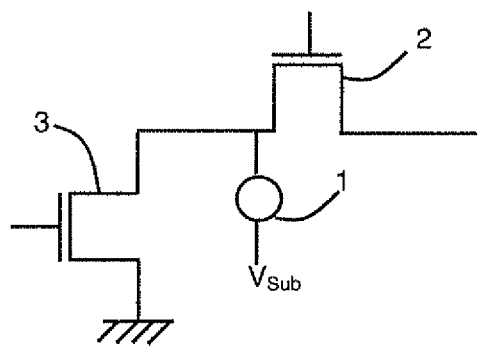

As illustrated in FIG. 1, photodetector 1 is for example a photodiode that is reverse biased, more precisely an NIP photodiode. It is also possible to use other photodetectors such as for example photodetectors of multiwell or multi-quantum well type. In this way, the photodiode delivers a current representative of the observed scene enabling quantification thereof. Photodetector 1 operates at low temperature, the working temperature typically being less than 20° C., and advantageously at a temperature of less than −73° C., preferably between −225° C. and −73° C. Low-temperature photodetector 1 is for example a photodiode made form CdHgTe, InSb or InGaAs materials. It is possible to use any detector called quantum or photovoltaic detector from the far infrared to the visible, therefore in the wavelength range comprised between 0.4 μm and 20 μm, for a temperature range from ambient temperature to −269° C.

When the cooled detector infrared is put into operation, lowering of the temperature of photodetector 1 takes place. The photodetector thus sees its temperature decrease from a first temperature, which is for example ambient temperature, to a second temperature, for example its working temperature. The second temperature is lower than the first temperature and the working temperature can be lower than or equal to the second temperature. When this temperature lowering takes place, or during at least a part of this temperature lowering, the photodetector is forward biased. This forward bias results in flow of a majority carrier current through the photodetector.

It has been discovered that application of this forward bias results in a reduced probability of the photodetector presenting an atypical behavior and/or excessive noise. This then results in a reduction of the number of photodetectors presenting an atypical behavior in the photodetector matrix.

Although it has not yet been verified, the hypothesis is put forward that the majority carrier current enables the electronic traps present in the photodetector to be filled and/or enables the carriers trapped on the electronic defects in the photodetector to recombine.

In this way, forward biasing of the photodetector when lowering the temperature means that the state of a large part of the electronic traps can be fixed thereby masking their effect on the photodetector.

On the one hand, applying this forward bias during cooling guarantees the efficiency of recombination and/or of trapping as this operation is begun at a higher temperature than the working temperature while at the same time preserving the integrity of the photodetector (the temperature increase linked to the strong current and to forward biasing is avoided). This operation further enables time to be gained in operational mode by using the time lost when decreasing the temperature to perform the fault masking protocol.

The photodetector then presents a reduced number of active electronic traps which greatly reduces its probability of being noisy and of having an atypical behavior.

In this way, in a photodetector matrix, for example a photodiode matrix, forward biasing of the photodiodes when the temperature is lowered thus enables the quantity of atypical photodiodes (atypical pixels) to be reduced to a non-negligible extent in simple manner. This method, instead of eliminating the atypical pixels artificially from the measuring area by excluding those whose functioning is suspect, enables the number of pixels to be increased by freezing the effect of a part of the electronic traps present in the photodiodes. This freezing effect is particularly effective for temperatures below −73° C.

In a particular embodiment illustrated in FIG. 1, the infrared detector comprises a photodetector 1 connected in series with a bias transistor 2. Photodetector 1 comprises a first terminal common with bias transistor 2. The other terminal of photodetector 1 is connected to a potential connection $V_{Sub}$, for example a potential connection representative of the potential of the substrate on which photodetector 1 is integrated. In this way, one of the terminals of photodetector 1 has a potential that is equal to that of the substrate. In conventional manner, bias transistor 2 switching to an on state reverse biases the photodiode. Bias transistor 2 is connected between photodetector 1 and a circuitry for applying a reverse bias.

The infrared detector also comprises an additional transistor 3 that has a first terminal coupled to the first terminal of bias transistor 2, i.e. to the common terminal between photodetector 1 and bias transistor 2. The second terminal of additional transistor 3 is coupled to a predefined potential, for example ground, which enables a second bias, forward bias, to be applied to the photodetector.

Bias transistor 2 and additional transistor 3 both have a control terminal which, depending on the biases applied, switches the transistor to an off or on state. The bias transistor is for example a MOS field effect transistor or a bipolar transistor or a JFET transistor or any other active component enabling the applied current to be modulated.

When it is put into operation, i.e. when it is conditioned, lowering of the temperature of photodetector 1 and possibly of a part of the electronic circuitry associated therewith is performed. The temperature of at least a part of the infrared detector (at least the photodetector) is reduced from a first temperature (for example ambient temperature) to a second temperature lower than the first temperature, for example working temperature. During this temperature decrease, forward biasing of the photodetector and injection of carriers into the photodetector enables a part of the defects arising from the photodetector fabrication method to be eliminated or masked. A majority carrier current thereby flows through photodetector 1 when the temperature is lowered.

Advantageously, forward biasing and injection of carriers are performed throughout the temperature decrease, but it is also conceivable for current flow to only take place during one or more parts of the temperature reduction.

Once the second temperature or working temperature has been reached, the photodetector is no longer forward biased. It is advantageously reverse biased in order to play the role of photodetector which delivers a current representative of the observed scene.

In this way, the charge states, traps and in general manner a part of the defects present in photodetector 1 are fixed by the carriers coming from the current linked to forward biasing of the photodetector. The majority carriers recombine and/or saturate the traps which fixes their initial state in identical manner at each cooling. This state is able to be kept by means of the continuous working of photodetector 1 at low temperature under the same type of bias, reverse bias. Advantageously, working at a temperature of less than −73° C. enhances fixing of the majority carriers on the defects.

Implementing forward bias on the photodetector when the temperature is lowered can be performed manually or in automated manner.

For example, if the additional transistor is an NMOS transistor and is grounded, switching to on state is achieved by applying a potential higher than or equal 0.7V on the control electrode. If the bias transistor is an NMOS transistor, switching to off state is achieved by applying a potential of about 0V on the control electrode. Switching of bias transistor 2 and additional transistor 3 between their on and off states enables the photodetector to be switched to forward bias or reverse bias. In preferential manner, the states of the bias transistor and of the additional transistor are opposite.

During the forward bias phase of the photodetector, a fixed potential depending on the type of photodetector (for example P/N or NIP photodiodes) is applied. The potential of the photodiode is in this case fixed via the substrate potential $V_{SUB}$, for example at 3.3V for the P/N photodiode.

By beginning the masking operation at a higher temperature than the working temperature of the device, masking of all the defects is authorized or there is a greater probability of masking these defects which is not possible at working temperature. Lowering the temperature enables the maskwork obtained at a higher temperature to be frozen.

In other words, by working at high temperature, filling and masking of all the defects present in the bandgap is facilitated. When working temperature is reached, it is ensured that most or even all of the traps have interacted with the majority carrier current.

This dissociation of the masking phase (when lowering the temperature) and of the useful operating phase (data acquisition phase) at working temperature enables high refresh frequencies of photodetector 1 associated with its read circuit 4 to be maintained. In this way, the defects present are masked by the majority carriers and, during the acquisition phase (functional mode), frequencies higher than 100 Hz, typically frequencies of about 2 kHz, are accessible. The acquisition phase is performed by reverse biasing the photodetector at the wotking temperature.

Figure 2:
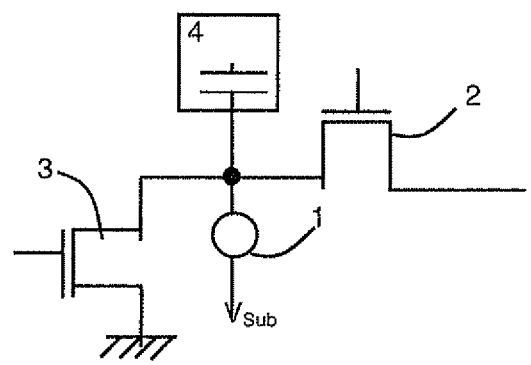

In the acquisition phase, the photodetector is associated with a read circuit of the radiation received by photodiode 1. Read circuit 4 comprises a circuitry for reading the information emitted by the photodiode and stored in a capacitive charge. In preferential manner illustrated in FIG. 2, read circuit 4 also comprises reset means of the capacitive charge so as to perform a plurality of acquisitions at the desired frequency, for example a transistor connected in parallel with the capacitor. Read circuit 4 is for example a direct injection circuit, a buffered direct injection circuit or a capacitive transimpedance amplifier. It is also conceivable to use the internal capacitor of photodiode 1. Reverse biasing can also be applied directly by read circuit 4 and transistor 2 is then arranged between photodiode 1 and read circuit 4.

During information acquisition, the photodetector is subjected to a first bias which enables the light signal emitted by the scene to be transformed into a representative electric signal. During the temperature decrease of the infrared detector, the photodetector is subjected to a second bias which is the opposite of the first bias and is in generic manner referred to as "reverse bias" assimilating the detector to a diode.

The invention claimed is:
1. A method for putting an infrared detector into operation comprising:
providing the infrared photodetector having a photodiode and a readout circuit, lowering the temperature of the photodiode from a first temperature to a working temperature lower than the first temperature, applying a forward bias to the terminals of the photodiode during lowering the temperature of the photodiode from the first temperature to a second temperature higher or equal to the working temperature, and applying a reverse bias condition to the terminals of the photodiode after the photodiode has reached the working temperature so as to cause the photodiode to transform an optical signal into an electric current while maintaining the temperature of the photodiode at the working temperature.

2. The method according to claim 1, further comprising:
turning off a bias transistor that is connected in series with the photodiode of the infrared detector so as to place the bias transistor in an off state, and switching an additional transistor having a first terminal connected to: (1) a common terminal of the bias transistor, (2) a common terminal of the photodiode, and (3) a grounded second terminal so s to place the additional transistor in an on state.

3. The method according to claim 1, further comprising:
an acquisition step for collecting an electrical current at a frequency of more than 100 Hz if the photodiode is reverse biased and is at the working temperature.

4. The method according to claim 3, wherein the readout circuit includes a capacitive charge configured for storing the electric on provided by the photodiode, the acquisition step including collecting a signal in the capacitive charge at a frequency of more than 100 Hz.

5. The method according to claim 1, further comprising:
applying a forward bias to the terminals of the photodiode when the temperature is below −73° C. during the step of lowering the temperature of the photodiode from the first temperature to the working temperature.

6. The method according to claim 1, further comprising:
applying a forward bias to the terminals of the photodiode between −73° C. and −225° C. during lowering the temperature from the first temperature to the working temperature.

7. A method for putting an infrared detector into operation comprising:
providing the infrared photodetector comprising a photodiode, lowering continuously the temperature of the photodiode from a first temperature to a working temperature lower than the first temperature, applying a forward bias to the terminals of the photodiode during lowering of the temperature from the first temperature down to a second temperature, the second temperature being lower than the first temperature and greater or equal to the working temperature, applying a reverse bias to the terminals of the photodiode at the working temperature.

8. The method according to claim 7, wherein the detector including a capacitive charge coupled to the photodiode, the method further comprising:
storing a current coming from the photodiode into the capacitive charge so as to form a first data and analyzing the data by a read circuit coupled to the capacitive charge at the working temperature.

9. The method according to claim 8, wherein the read circuit includes a reset circuit configured to reset charges carriers stocked in the capacitive charge, the method further comprising:
performing the analysis of the data at a frequency of more than 100 Hz.

* * * * *